United States Patent
Lin et al.

(10) Patent No.: US 7,397,127 B2
(45) Date of Patent: Jul. 8, 2008

(54) BONDING AND PROBING PAD STRUCTURES

(75) Inventors: Liang-Chen Lin, Baoshan Shiang (TW); Pei-Haw Tsao, Tai-Chung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/539,498

(22) Filed: Oct. 6, 2006

(65) Prior Publication Data

US 2008/0083992 A1    Apr. 10, 2008

(51) Int. Cl.
*H01L 23/48* (2006.01)
*H01L 23/52* (2006.01)
*H01L 29/40* (2006.01)

(52) U.S. Cl. ............... 257/773; 257/779; 257/780; 257/786; 257/E23.02

(58) Field of Classification Search ............... 257/773, 257/779–781, 784, 786, E23.02, E23.021, 257/E23.069
See application file for complete search history.

(56) References Cited

U.S. PATENT DOCUMENTS 6,614,091 B1   9/2003   Downey
2003/0173667 A1*  9/2003  Yong et al. .................. 257/748

* cited by examiner

*Primary Examiner*—Hoai v Pham
(74) *Attorney, Agent, or Firm*—Duane Morris LLP

(57) ABSTRACT

A pad structure includes a first metal-containing layer formed over a substrate. A first passivation layer is formed over the first metal-containing layer. The first passivation layer has a first opening partially exposing the first metal-containing layer. A pad layer is formed over the first passivation layer, covering the first opening. The pad layer includes a probing region configured to be contacted by a probe and a bonding region configured to have a wired bonded to it. The probing region contacts the first metal-containing layer through the first opening, and the bonding region overlies a portion of the first passivation layer.

17 Claims, 13 Drawing Sheets

BONDING AND PROBING PAD STRUCTURES

BACKGROUND OF THE INVENTION

1. Field of the Invention

The present invention relates to semiconductor structures and methods of forming the semiconductor structures, and more particularly to pad structures and methods of forming the pad structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals, dimensions of semiconductor integrated circuits continue to shrink. Various materials and techniques have been proposed to achieve these integration and speed goals and to overcome manufacturing obstacles associated therewith. In order to reduce die size, pads are formed on a region under which active or functional devices or circuits are formed, instead limited to peripheral regions of the die.

Generally, a chip having a pad formed thereover will be subjected to an electrical test during a probing step. The probing step uses a probe touching or contacting the pad for collecting electrical characteristics of devices or circuits coupled to the pad. If the electrical characteristics of devices or circuits exhibit predefined acceptance values, the chip is packaged for assembling with another substrate, such as a printed circuit board (PCB), through wire bonds. Each of the wire bonds is bonded over a respective pad. Accordingly, a pad thus is subjected to a probing force and a bonding force during the probing step and the bonding step, respectively.

If a pad dimension is reduced, the wire bond may be bonded over a region of the pad that is damaged by a probe. The contact between the pad and the wire bond is subjected to subsequent tests, such as a reliability test. In addition, the same region of the pad subjected to both a probing test and a bonding step may not tolerate the combined forces thereof. Accordingly, a "circuit under pad (CUP)" structure which includes a probing region and a bonding region for separately sustaining the probing force and the bonding force has been proposed to solve the problem.

FIG. 1A is a cross-sectional view of a prior art CUP structure. In this figure, contacts 113, 123, 135 and metal layers 115, 125 and 150 are sequentially formed over the substrate 100. Dielectric layers 110, 120, 130 are sequentially formed between the substrate 100 and metal layer 115, between the metal layers 115 and 125, and between the metal layers 125 and 150, respectively. A passivation layer 160 is formed over the dielectric layer 130 and a portion of the metal layer 150. A pad layer 170 including a probing region 170b and a bonding region 170a is formed over the passivation layer 160, contacting with the metal layer 150. A passivation layer 180 is formed over the passivation layer 160, having an opening (not labeled) partially exposing the pad layer 170.

Generally, the metal layers 150 and 125 are referred to as "a top metal layer $M_{top}$" and "a secondary top metal layer $M_{top-1}$." The metal layer 115 includes an active or functional circuit pattern. As shown in FIG. 1A, the metal layers 150 and 125 serve only as buffer layers which provide desired mechanical strength against the probing and bonding forces. With the buffer layers 125 and 150, the dielectric layer 120 and the routed circuit of the metal layer 115 under the pad layer 170 are less susceptible to damage during the probing step and bonding step. However, the use of the metal layer 125 as a buffer layer under the pad layer 170 reduces the routing area of the circuit pattern 126 formed at the same layer of the metal layer 125. Accordingly, the reduction in the die area is limited.

In order to solve the problem described above, another pad structure has been proposed as shown in FIG. 1B. In this figure, the passivation layer 160 extends into a region between the probing region 170b and the metal layer 150. The passivation layer 160 under the probing region 170b serves as a buffer layer for a probing step, but the metal layer 125 under the bonding region 170a still serves as a buffer layer. Accordingly, active or functional circuits 126 can be routed under the probing region 170b, and more routing area is accessible, compared with the structure shown in FIG. 1A. However, the probing step may crack the passivation layer 160 under the probing region 170b, because the passivation layer 160, i.e., an oxide layer, is less elastic than a metal layer. The cracking 175 occurring in the passivation layer 160 causes product reliability concerns at this area.

From the foregoing, improved pad structures and methods of forming the pad structures are desired.

SUMMARY OF THE INVENTION

In accordance with some exemplary embodiments, a pad structure includes a first metal-containing layer formed over a substrate. A first passivation layer is formed over the first metal-containing layer. The first passivation layer has a first opening partially exposing the first metal-containing layer. A pad layer is formed over the first passivation layer, covering the first opening. The pad layer includes a probing region configured to be contacted by a probe and a bonding region configured to have a wired bonded thereto, wherein the probing region contacts the first metal-containing layer through the first opening, and the bonding region overlies a portion of the first passivation layer.

In accordance with some exemplary embodiments, a method of forming a pad structure is provided. A first metal-containing layer is formed over a substrate. A first passivation layer is formed over the first metal-containing layer. The first passivation layer has a first opening partially exposing the first metal-containing layer. A pad layer is formed over the first passivation layer, covering the first opening. The pad layer includes a probing region and a bonding region, wherein the probing region contacts the first metal-containing layer through the first opening, and the bonding region overlies a portion of the first passivation layer.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 2H-2K are schematic cross-sectional views of exemplary pad structures.

DESCRIPTION OF THE PREFERRED EMBODIMENT

Figure 1A:
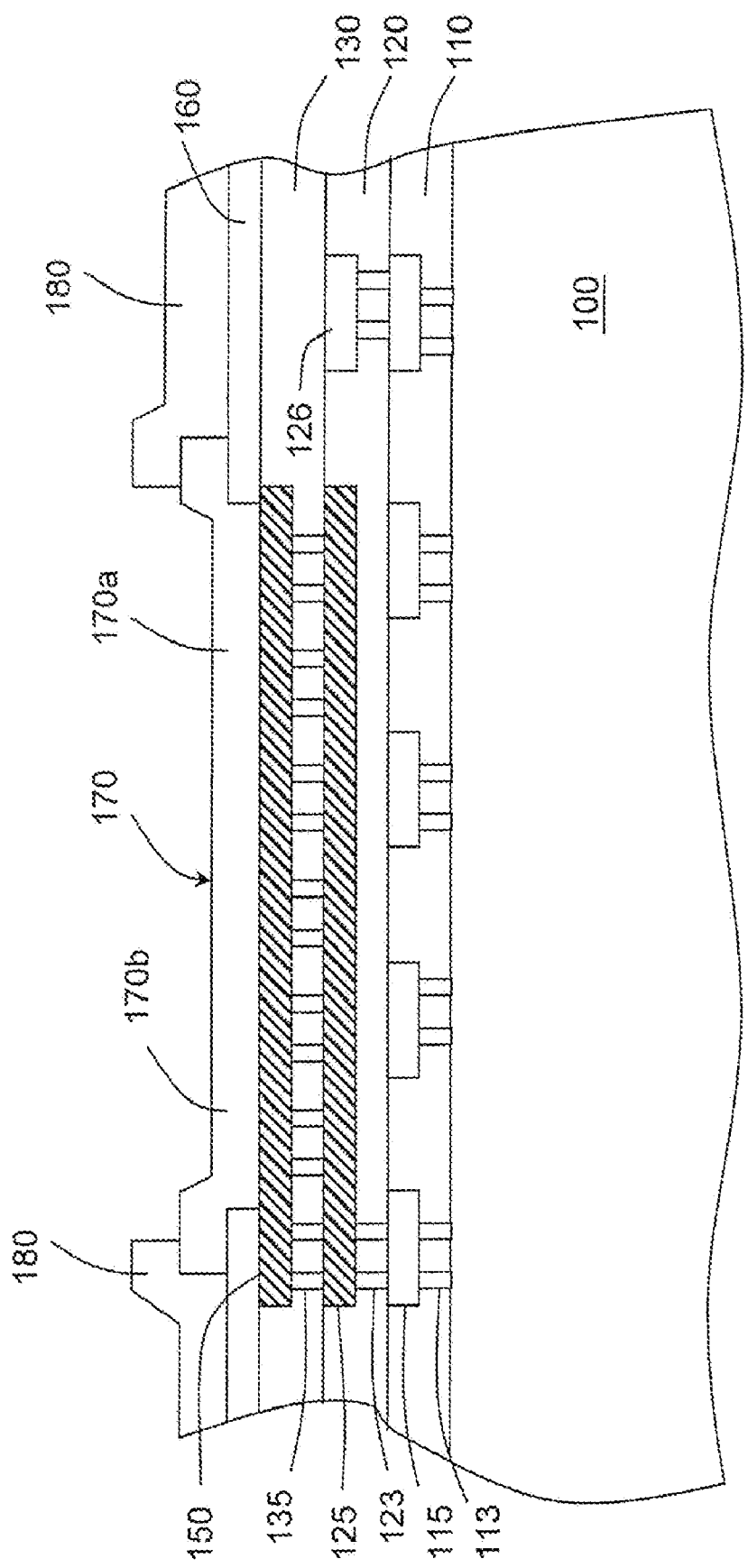
FIGS. 1A and 1B are cross-sectional views of prior art CUP structures.
Figure 1B:
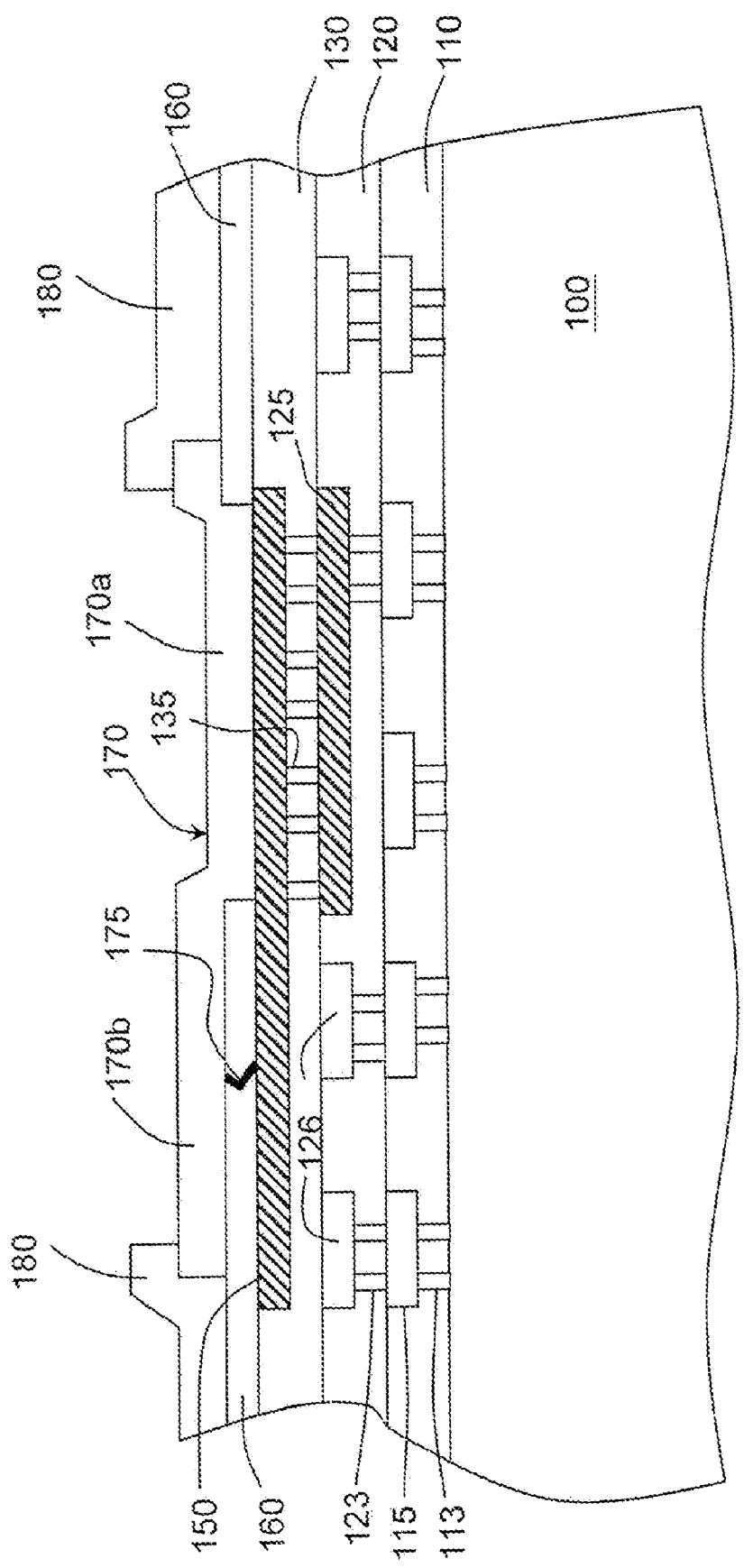

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2D are schematic cross-sectional views of an exemplary method of forming a pad structure. The pad structure is generally referred to as a "circuit under pad (CUP) structure."

Figure 2A:
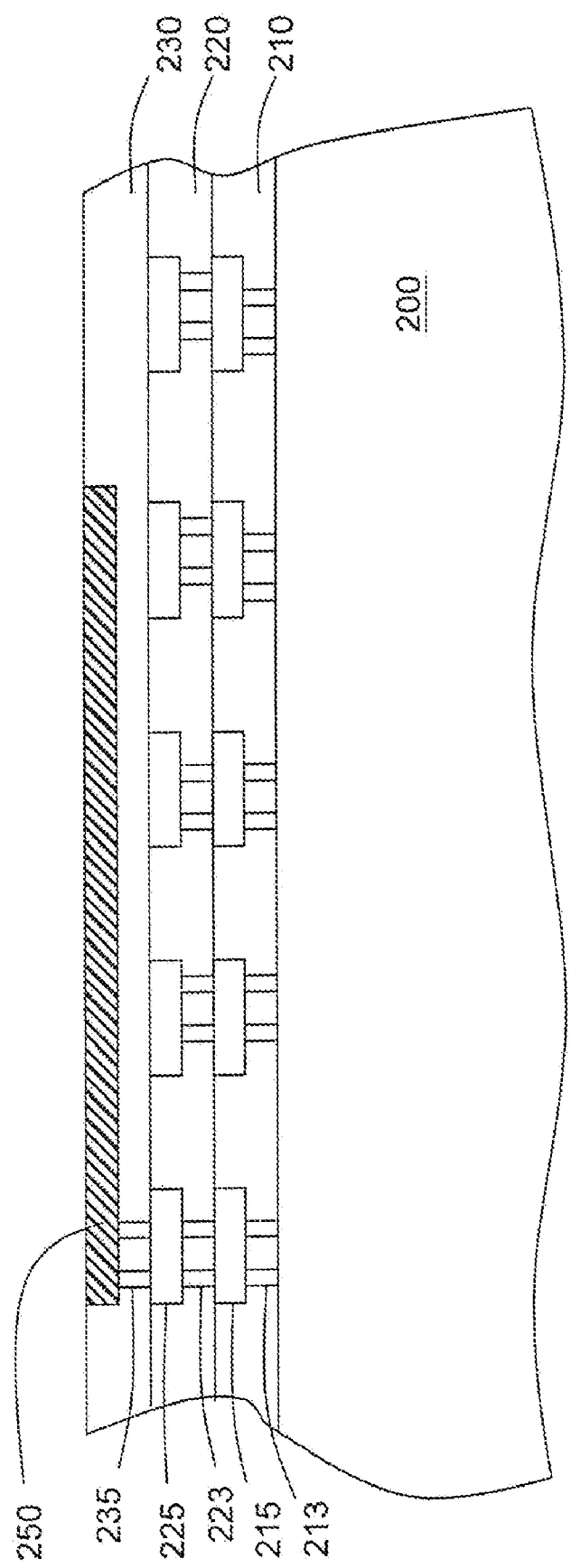
FIGS. 2A-2D are schematic cross-sectional views of an exemplary method of forming a pad structure.

Referring to FIG. 2A, a multi-level structure (not labeled) is formed over a substrate 200. The multi-level structure may comprise, for example, dielectric layers 210, 220, 230 and 240, and conductive structures 213, 215, 223, 225, 235 and 250. The substrate 200 can be a silicon substrate, III-V compound substrate, display substrate such as a liquid crystal display (LCD), plasma display, electro luminescence (EL) lamp display, or light emitting diode (LED) substrate (collectively referred to as, substrate 200), for example.

The dielectric layers 210, 220, 230 and 240 may comprise, for example, an oxide layer, nitride layer, oxynitride layer, low-k dielectric material layer, ultra-low-k dielectric material layer, combinations thereof of the like. The dielectric layers 210, 220, 230 and 240 may be formed by, for example, a chemical vapor deposition (CVD) step or the like. The conductive structures 213, 223 and 235 may comprise, for example, contacts, vias, damascene structures, dual damascene structures, combinations thereof or the like. In some embodiments, the conductive structures 213, 223 and 235 may comprise an aluminum (Al) layer, copper (Cu) layer, AlCu layer, titanium (Ti) layer, titanium nitride (TiN) layer, tantalum (Ta) layer, tantalum nitride (TaN) layer, combinations thereof or the like. The conductive structures 215, 225 and 250 may comprise a metal-containing line, metal-containing pattern, damascene structure, dual damascene structure, combinations thereof or the like. In some embodiments, the conductive structures 215, 225 and 250 may comprise an Al layer, Cu layer, AlCu layer, Ti layer, TiN layer, Ta layer, TaN layer, combinations thereof or the like. The conductive structures 213, 215, 223, 225, 235 and 250 may be formed by, for example, a CVD step, physical vapor deposition (PVD) step, electrochemical plating step, electroless plating step, combinations thereof or the like. In some embodiments, the conductive structures 215 and 225 may comprise a routed circuit pattern through which devices and/or diodes (not shown) formed over or within the substrate 200 are electrically coupled to each other. The conductive structure 250 may comprise a metal-containing layer through which a pad is electrically coupled to the conductive structures 225 and/or 215, i.e., the routed circuit patterns. In some embodiments, the conductive structure 250 may comprise, for example, at least one opening (not shown) in which a dielectric layer (not shown) is formed. The conductive structures 213, 215, 223, 225, 235 and 250 can be formed within the dielectric layers 210-240 by any via/contact processing steps, metal line processing steps, damascene processing steps, dual damascene processing steps, combinations thereof or the like. In some preferred embodiments, the conductive structure 250 comprises a Cu layer having a thickness of about 9,000 Å.

The layer of the conductive structure 250 is generally referred to as the "top metal layer (symbolized as $M_{top}$)." In some embodiments, at least one additional conductive structure (not shown) may be formed on the same layer as the conductive structure 250. The additional conductive structure (not shown) is provided for interconnection with other conductive structures formed in other layers. The conductive structures 225 are formed adjacent to and under the conductive structure 250. The layer of the conductive structures 225 is generally referred to as the "secondary top metal layer (symbolized as $M_{top-1}$)." As shown in FIG. 2A, the conductive structure 250 covers a part of the routed circuit pattern of the conductive structures 225. Though FIG. 2A only shows three layers of conductive structures, the present invention, however, is not limited thereto. The number of the layers varies with the manufacturing technique. In some embodiments, more or less than three layers of conductive structures may be formed in order to achieve a desired circuit.

Figure 2B:
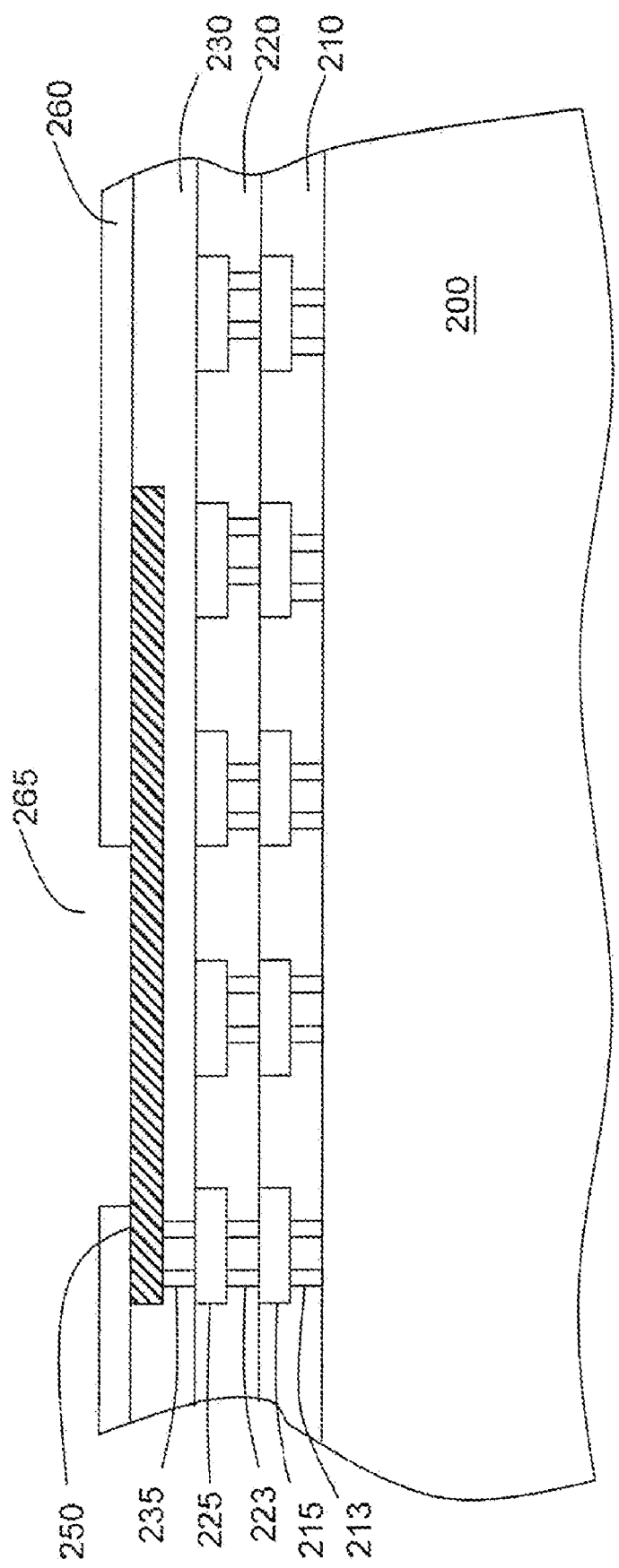

Referring to FIG. 2B, a passivation layer 260 is formed over the conductive structure 250, comprising an opening 265 formed therein partially exposing the surface (not labeled) of the conductive structure 250. The passivation layer 260 may comprise, for example, an oxide layer, nitride layer, oxynitride layer, polyimide layer, combinations thereof or the like. In some preferred embodiments, the passivation layer 260 comprises an oxide layer having a thickness of about 4,000 Å, and is formed by a CVD step. The opening 265 may be formed by, for example, a photolithographic step and an etch step. For example, a patterned photoresist layer (not shown) is formed over an initial passivation layer (provided for the formation of the passivation layer 260). The patterned photoresist layer has an opening (not shown) corresponding to the opening 265. An etch step then removes a portion of the initial passivation layer, partially exposing the conductive structure 250, thereby forming the passivation layer 260. After the etch step, a photoresist removal step is then used to remove the patterned photoresist.

Figure 2C:
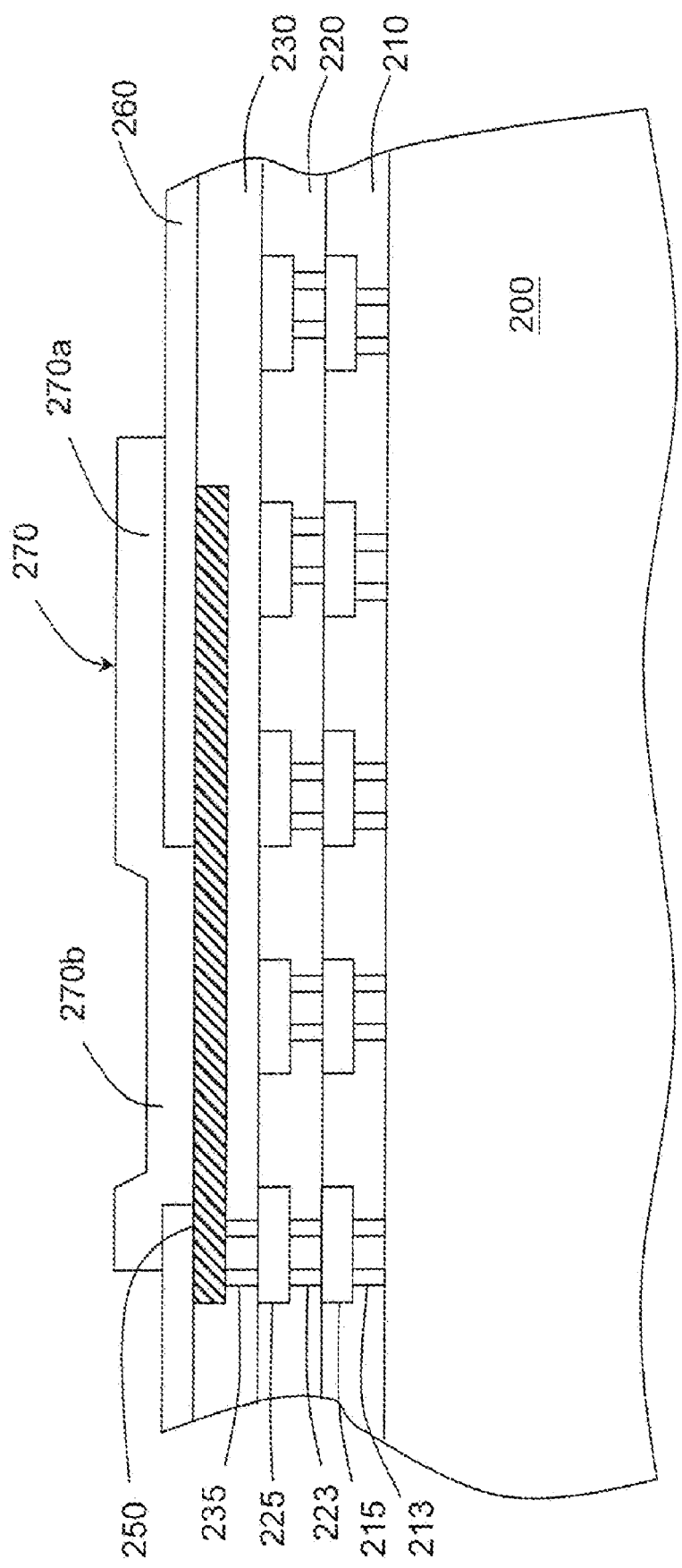

Referring to FIG. 2C, a pad layer 270 is formed over the passivation layer 260, covering the first opening 265 (shown in FIG. 2B). The pad layer 270 may comprise an Al layer, Cu layer, AlCu layer, AlSiCu layer, combinations thereof or the like. The pad layer 270 may be formed by, for example, a CVD step, PVD step, electrochemical plating step, electroless plating step, combinations thereof or the like. In some preferred embodiments, the pad layer 270 comprises an AlCu layer. The pad layer 270 may have a thickness of about 12,000 Å.

The pad layer 270 may be formed by a deposition step, a photolithographic step and an etch step. For example, a film layer (provided for the formation of the pad layer 270) is formed over the structure shown in FIG. 2B. A photoresist layer (not shown) is formed over the film layer. The photoresist layer is patterned, covering a region corresponding to the pattern of the pad layer 270. An etch process then removes portions of the pad layer 270 not covered by the patterned photoresist layer, thereby forming the pad layer 270. After the etch step, the patterned photoresist layer is removed by, for example, a photoresist removal step.

Referring again to FIG. 2C, the pad layer 270 may comprise a bonding region 270a upon which a bonding structure, e.g., wire bonding structure or flip chip bonding structure, is formed and a probing region 270b upon which a probe is applied. As shown in FIG. 2C, the passivation layer 260 is formed under the bonding region 270a. In other words, the passivation layer 260 extends into a region between the bonding region 270a and the conductive structure 250. In this stacked region, the extended region of the passivation layer 260 partially covers the routed pattern of the conductive structures 225, i.e., the $M_{top-1}$ layer.

Figure 2D:
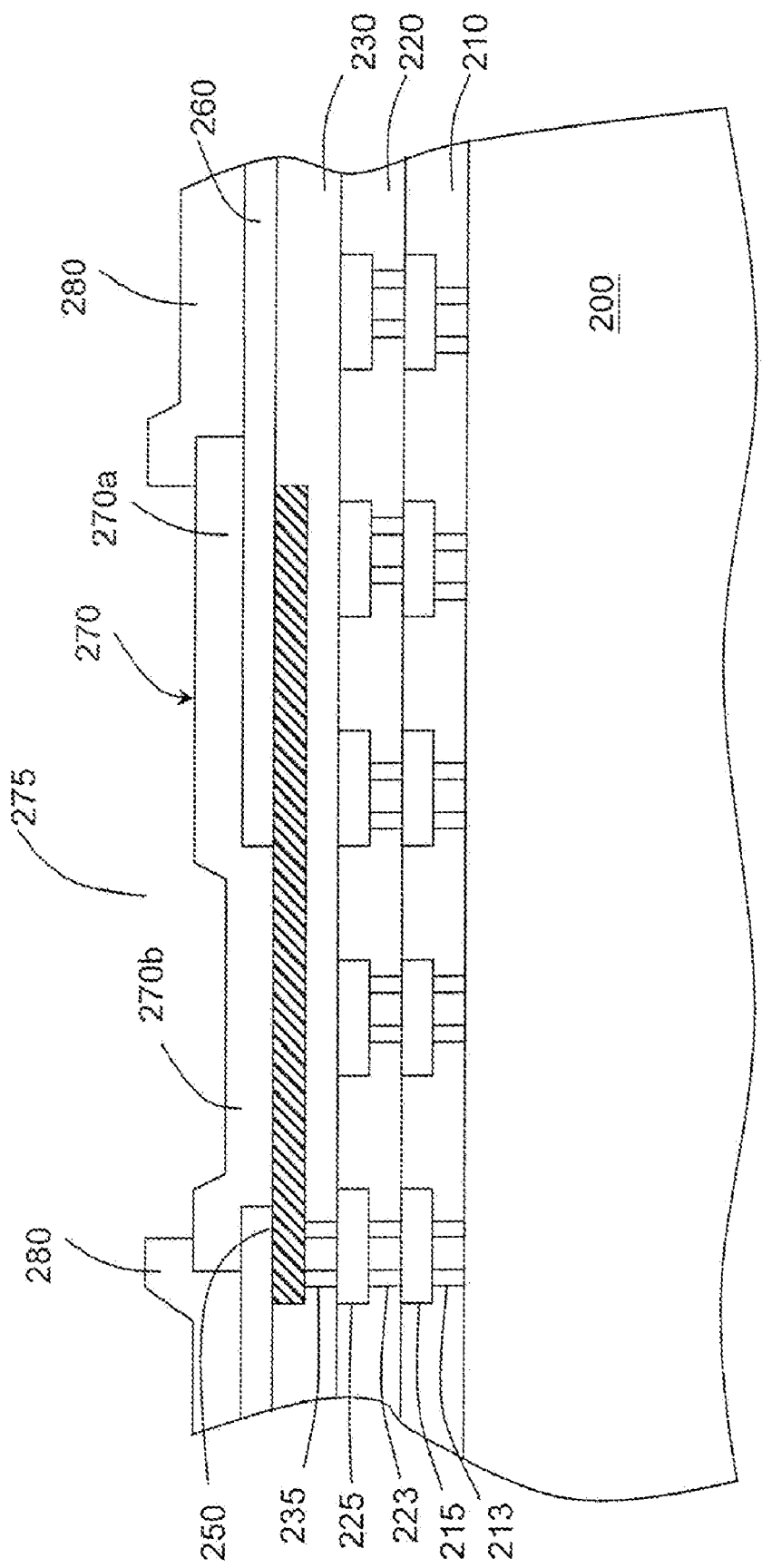

Referring to FIG. 2D, a second passivation layer 280 is formed over the first passivation layer 260, comprising an opening 275 formed therein partially exposing the top surface (not labeled) of the pad layer 270, i.e., the bonding region 270a and probing region 270b. The passivation layer 280 may comprise, for example, an oxide layer, nitride layer, oxynitride layer, polyimide layer, combinations thereof or the like. In some preferred embodiments, the passivation layer 260 comprises an oxide layer having a thickness of about 4,000Å and a nitride layer having a thickness of about 6,000 Å. The oxide layer and the nitride layer may be formed by a CVD step, for example. Features associated with the dimensions of the passivation layer 280 and the opening 275 are best seen in the plan view of FIG. 2G. In some embodiments, a pitch including the width "a" of the opening 275 and the space "b" between two openings 275, i.e., width of the passivation layer 280, is about 50 μm or less. In some embodiments, the space "b" is about 6 μm or less.

The opening 275 may be formed by, for example, a photolithographic step and an etch step. For example, a patterned photoresist layer (not shown) is formed over an initial passivation layer (provided for the formation of the passivation layer 260). The patterned photoresist layer has an opening (not shown) formed therein corresponding to the opening 275. An etch step then removes a portion of the initial passivation layer, partially exposing the pad layer 270, i.e. the bonding region 270a and the probing region 270b, thereby forming the passivation layer 280. After the etch step, a photoresist removal step is used to remove the patterned photoresist.

Figure 2E:
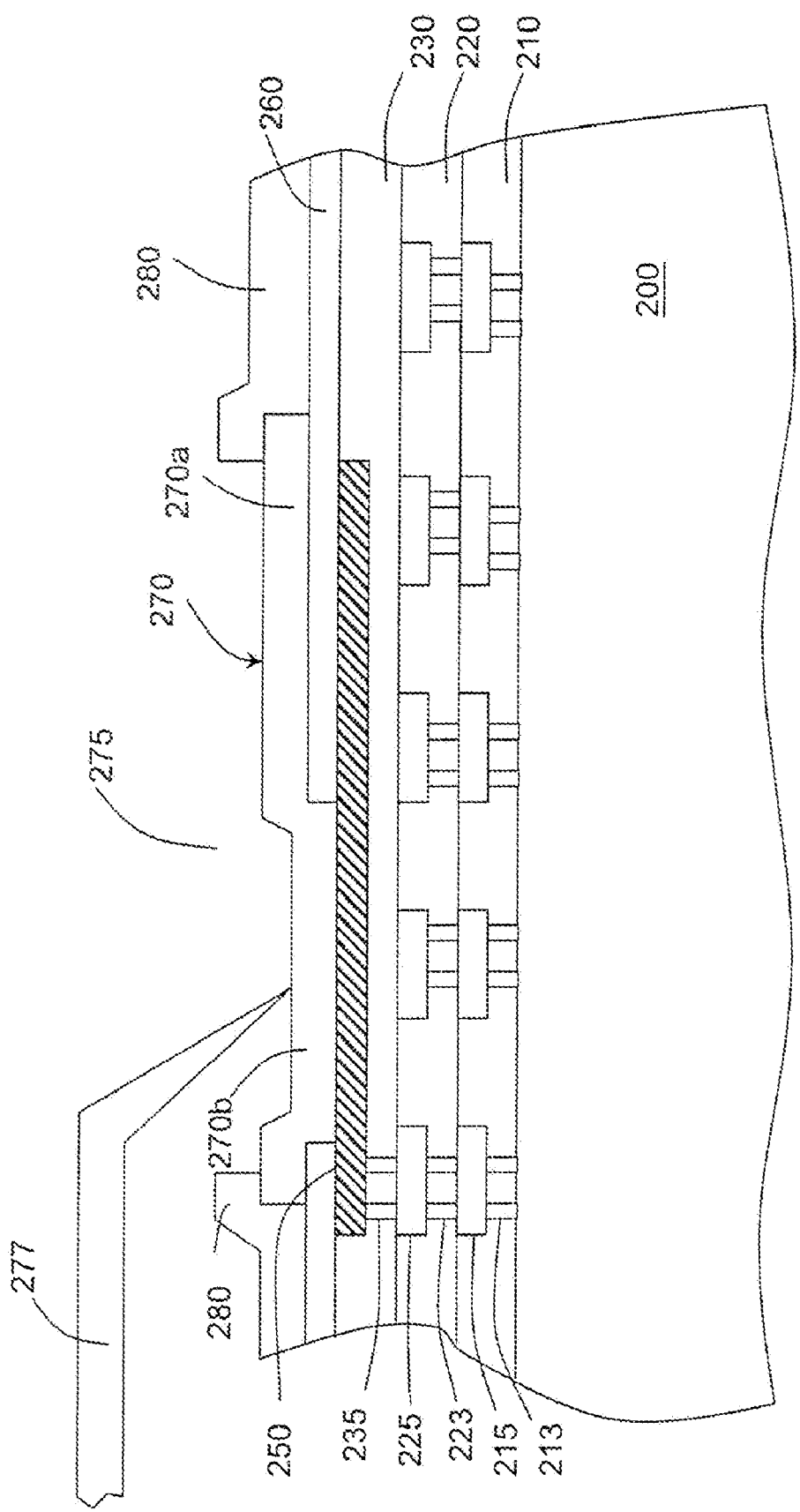
FIG. 2E is a schematic cross-sectional view showing a probe applied over the probing region.

FIG. 2E is a schematic cross-sectional view showing a probe 277 being applied to the probing region 270b. After the formation of the pad structure, devices, diodes and/or circuits formed over and within the substrate 200 are subjected to an electrical test for collecting signals indicating electrical performance thereof. During the electrical test, a probe 277 is directed and applied to the probing region 270b, contacting or penetrating into the pad layer 270, or even into the conductive structure 250. Since the pad layer 270 and the conductive structure 250 are metal-containing layers having desired elastic characteristics, the penetrating of the probe 277 does not crack the pad layer 270 and/or the conductive structure 250. In addition, the sum of the thicknesses of the pad layer 270 and the conductive structure 250 can tolerate the probing force and pressure applied by the probe 277 without cracking other material layers (e.g., the dielectric layer 230 formed directly thereunder or the routed circuit pattern of the conductive structures 225, i.e., $M_{top-1}$ layer).

Figure 2F:
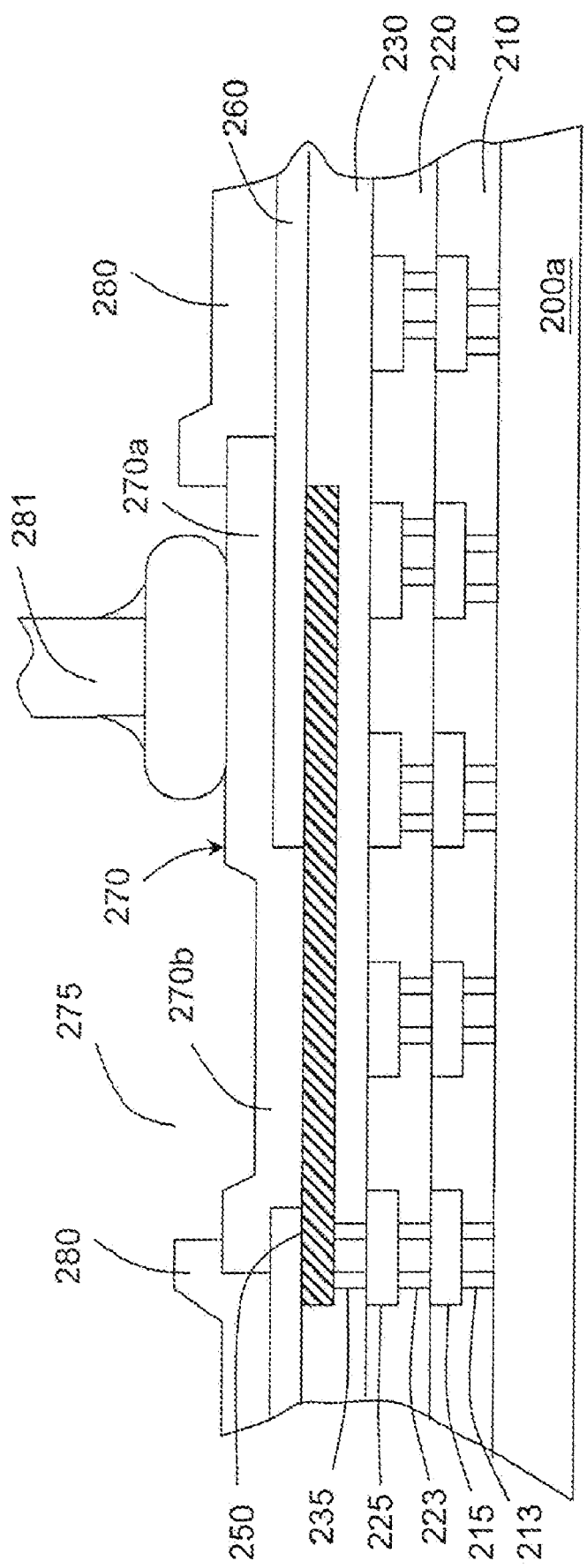
FIG. 2F is a schematic cross-sectional view showing a wire bond bonded over the pad structure of FIG. 2E.
Figure 2G:
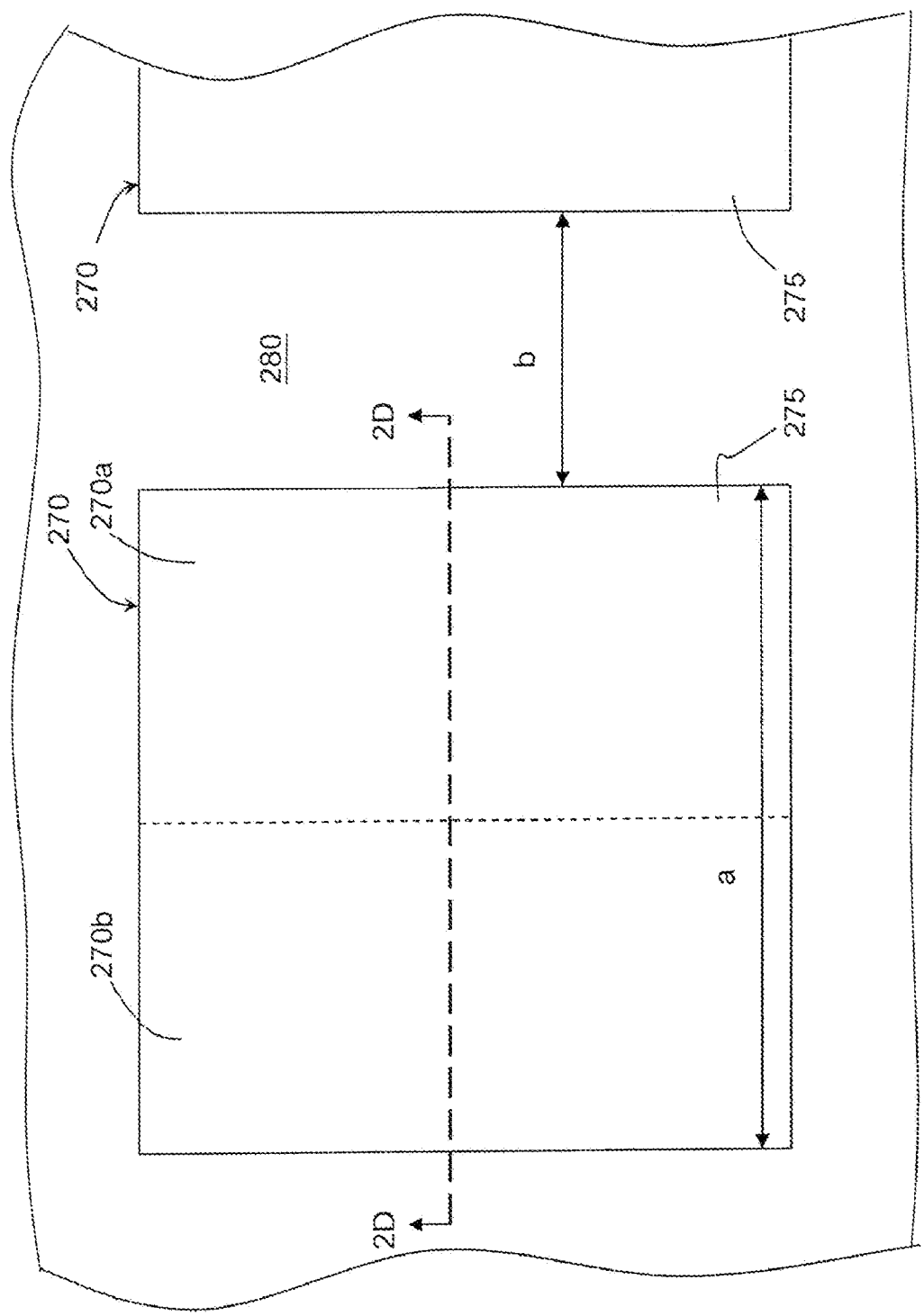
FIG. 2G is a schematic top view of the pad structure shown in FIG. 2D.

FIG. 2F is a schematic cross-sectional view showing a wire 281 bonded over the pad structure of FIG. 2E. After the probing electrical test, a substrate thinning step may be used to thin the substrate 200, thereby forming the thinned substrate 200a. The substrate thinning step may comprise, for example, a grinding step. After thinning the substrate 200, the substrate 200a is subjected to a dicing step for obtaining individual dies. Then, a wire 281 or flip-chip solder bump is bonded over the bonding region 270a as shown in FIG. 2F. As shown in this figure, the passivation layer 260 is formed between the bonding region 270a and the conductive structure 250. The combined mechanical strength of the bonding region 270a, the passivation layer 260 and/or the conductive structure 250 can tolerate the bonding force encountered during the bonding step such that the bonding step does not damage or crack the dielectric layer 230 and/or routed circuit pattern of the conductive structures 225 (i.e., $M_{top-1}$ layer), formed directly under the bonding region 270a.

From the foregoing, since neither the probing step nor the bonding step will damage the routed circuit pattern of the conductive structures 225, i.e., $M_{top-1}$ layer, it is not necessary for an additional metal-containing layer to be formed at the layer where the conductive structures 225 are formed to serve as a buffer layer. Accordingly, the whole layer of the conductive structures 225 is available for metal routing and electrical connection with other routed circuit patterns. The dimensions of the die thus can be desirably reduced.

Figure 2H:
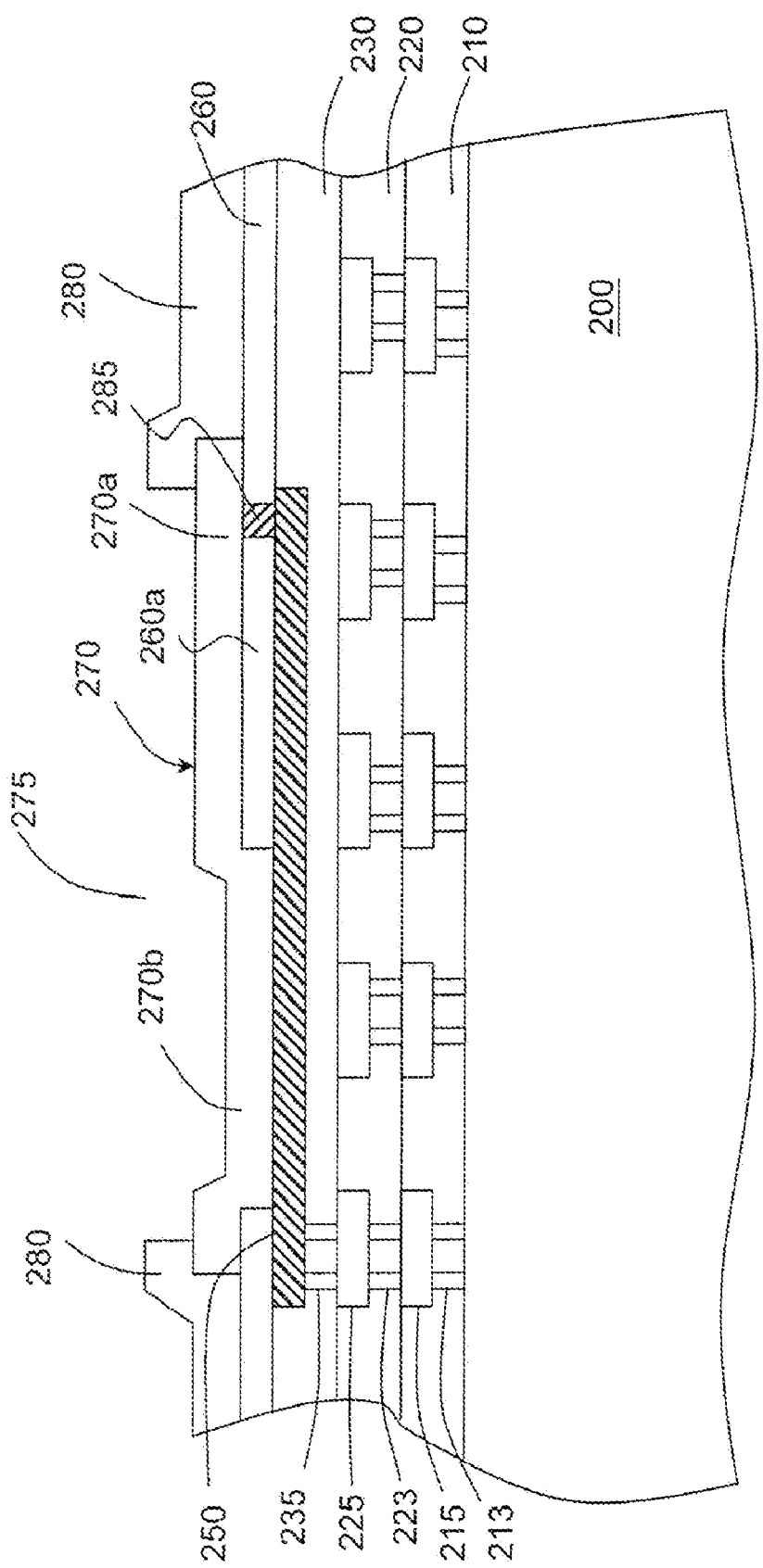
Figure 21:
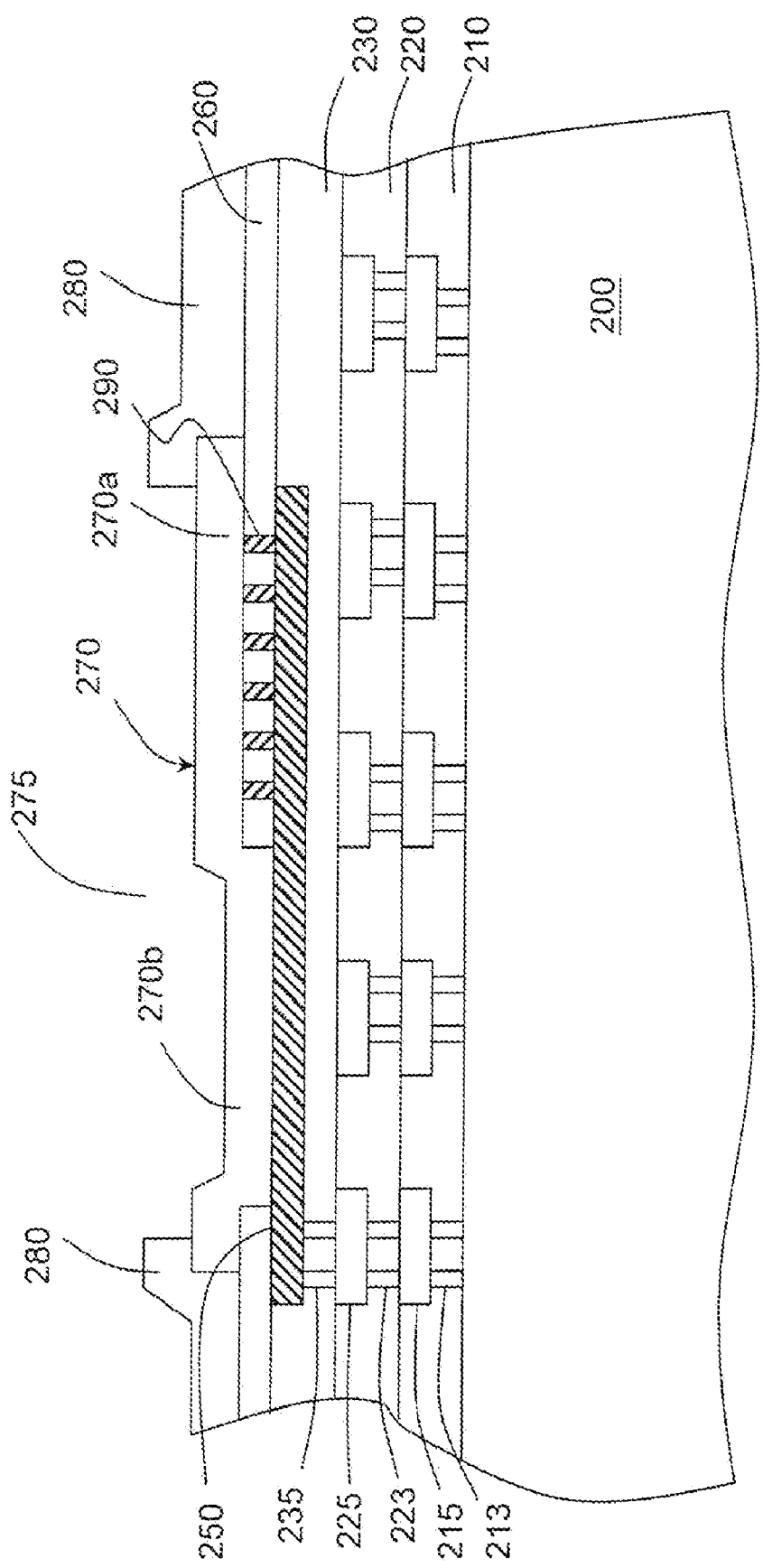

FIG. 2H is a schematic cross-sectional view showing another exemplary pad structure. In this figure, at least one conductive structure 285 is formed through the passivation layer 260, connecting the bonding region 270a and the conductive structure 250. The conductive structure 285 may comprise, for example, an Al layer, Cu layer, AlCu layer, combinations thereof or the like. The conductive structure 285 may comprise at least one via/contact structure, line structure, damascene structure, dual damascene structure, trench structure, combinations thereof or the like. In some embodiments, the conductive structure 285 cooperates with the pad layer 270 and the conductive structure 250, sealing the passivation structure 260a formed directly under the bonding region 270a. The conductive structure 285 provides additional electrical connection between the bonding region 270a and the conductive structure 250.

The conductive structure 285 may be formed in a manner similar to the pad layer 270 as described in connection with FIG. 2C. In some embodiments, the conductive structure 285 is formed by the same processing steps of forming the pad layer 270. In other embodiments, an additional film deposition step, photolithographic step and/or etch step are used for forming the conductive structure 285.

FIG. 2I is a schematic cross-sectional view showing an exemplary pad structure which comprises an array of conductive structures 290 formed through the passivation layer 260 under the bonding section 270a. The conductive structures 290 may be formed by a method which is the same or similar to that of forming the conductive structure 285 described above. The conductive structures 290 provide desired electrical connection between the bonding region 270a and the conductive structure 250.

Figure 2J:
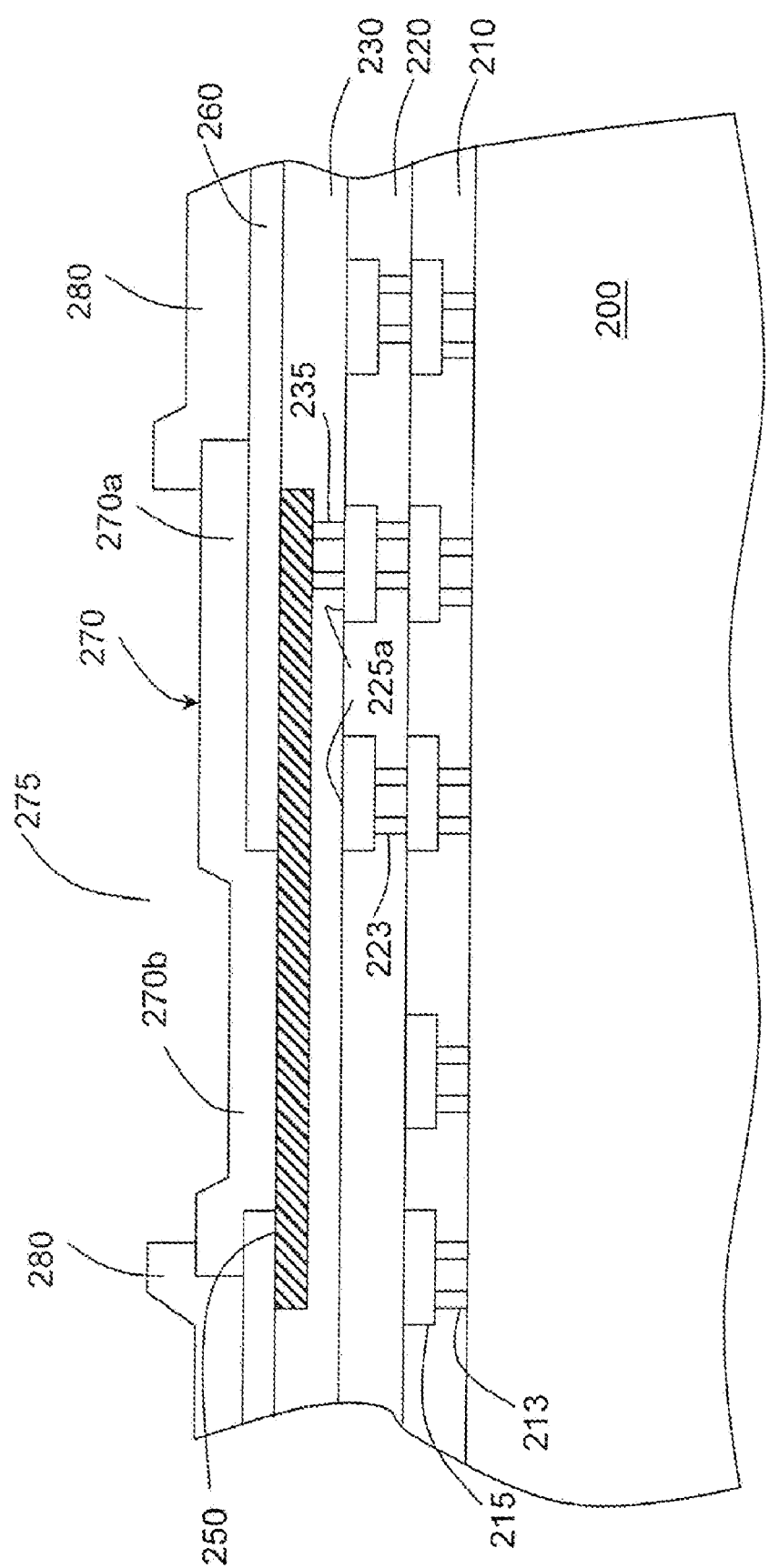

FIG. 2J is a schematic cross-sectional view showing an exemplary pad structure in which no routed circuit of the conductive structures 225a, i.e., the $M_{top-1}$ layer, is formed directly under the probing region 270b. The conductive structures 225a may be formed by a method which is the same as or similar to that of forming the conductive structure 225 as described in connection with FIG. 2A. As shown in this figure, the pattern of the conductive structures 225a are routed around the region directly under the bonding region 270a, providing electrical interconnect with other conductive structures formed on the same or different layers. Accordingly, in this embodiment, even if the pad layer 270 and the conductive structure 250 cannot tolerate the probing force, no routed circuit of the conductive structures 225a will be damaged directly under the probing region 270b.

Figure 2K:
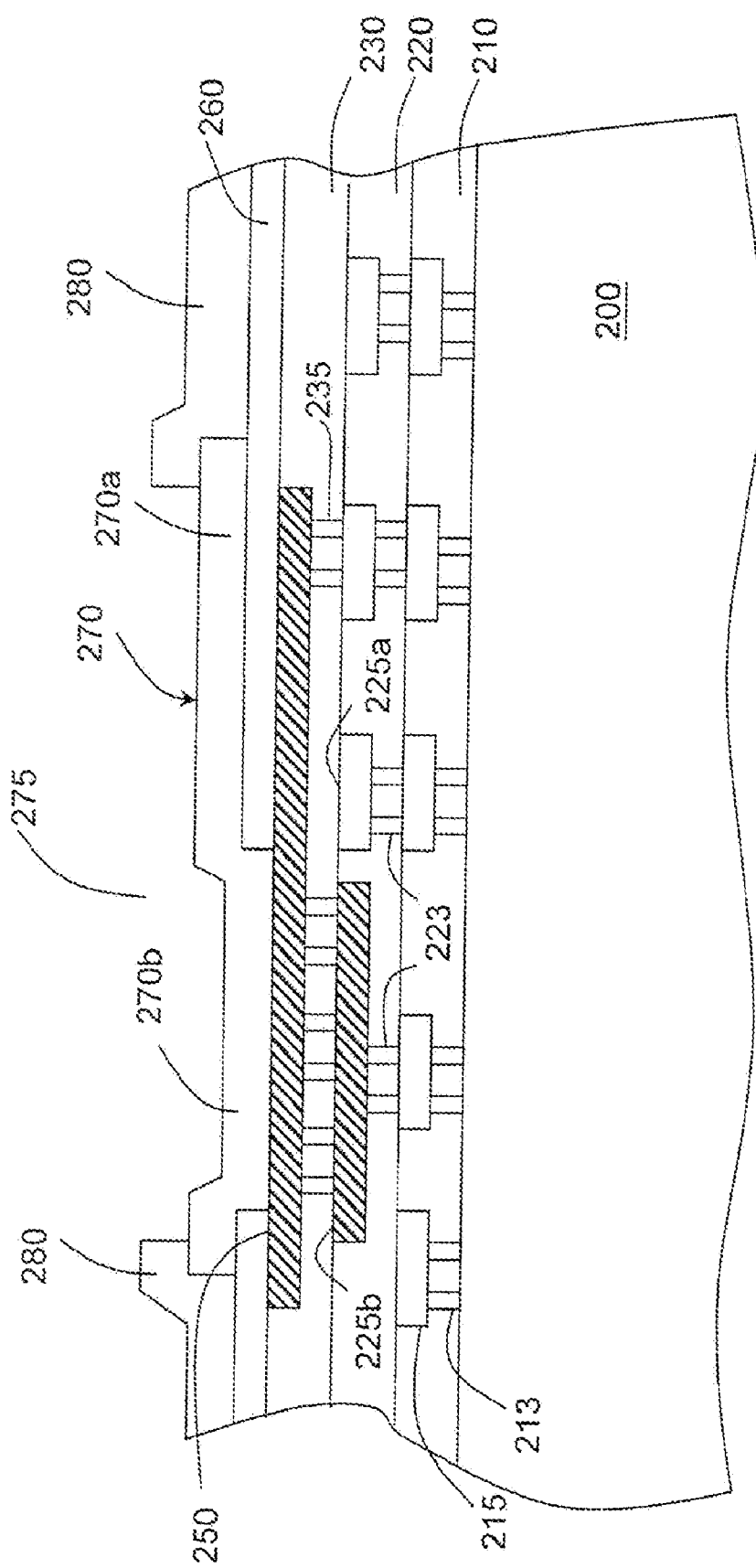

In still other embodiments, a conductive structure 225b is formed under the probing region 270b as shown in FIG. 2K. In this embodiments, the conductive structure 225b is provided as a buffer layer, i.e., not a functional circuit, but an electrical interconnect between the conductive structures 215 and 250, so as to better protect the routed circuit of the conductive structures 215, i.e., the $M_{top-2}$ layer, formed directly under the conductive structure 225b. The conductive structure 225b may be formed in a manner which is the same as or similar to that of forming the conductive structures 225a. In some embodiments, the conductive structure 225b is formed by the same steps of forming the conductive structures 225 as described above in connection with FIG. 2A. In other embodiments, an additional photolithographic step, etch step and/or film deposition step are used for the formation of the conductive structure 225b.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A pad structure, comprising:
   a first metal-containing layer formed over a substrate;
   a first passivation layer formed over the first metal-containing layer, the first passivation layer having a first opening partially exposing the first metal-containing layer; and
   a pad layer formed over the first passivation layer and covering the first opening, the pad layer comprising a probing region configured to be contacted by a probe and a bonding region configured to have a wire bonded thereto, wherein the probing region contacts the first metal-containing layer through the first opening, and the bonding region overlies a portion of the first passivation layer; and
   a conductive structure formed through the first passivation layer, connecting the bonding region and the first metal-containing layer.

2. The pad structure of claim 1, further comprising a second metal-containing layer formed adjacent to and below the first metal-containing layer, wherein the second metal-containing layer comprises a circuit pattern routed under the bonding region.

3. The pad structure of claim 2, wherein the circuit pattern is further routed under the probing region.

4. The pad structure of claim 1, wherein the conductive structure seals the first passivation layer formed under the bonding region.

5. The pad structure of claim 1, wherein the conductive structure comprises an array of conductive contacts or vias.

6. The pad structure of claim 1, further comprising a second passivation layer formed over the first passivation layer, the second passivation layer comprising a second opening exposing the probing region and the bonding region.

7. A pad structure, comprising:
   a first metal-containing layer formed over a substrate, the first metal-containing layer comprising a circuit pattern;
   a second metal-containing layer formed adjacent to and over the first metal-containing layer;
   a first passivation layer formed over the second metal-containing layer, the first passivation layer having a first opening partially exposing the second metal-containing layer;
   a pad layer formed over the first passivation layer and covering the first opening, the pad layer comprising a probing region and a bonding region, the bonding region overlying a portion of the first passivation layer, and
   a conductive structure formed through the first passivation layer, connecting the bonding region and the second metal-containing layer;
   wherein the probing region contacts the second metal-containing layer through the first opening; and
   the circuit pattern is routed under the bonding region; and
   a second passivation layer is formed over the first passivation layer, the second passivation layer comprising a second opening exposing the probing region and the bonding region.

8. The pad structure of claim 7, wherein the conductive structure seals the first passivation layer formed under the bonding region.

9. The pad structure of claim 7, wherein the conductive structure comprises an array of conductive contacts or vias.

10. The pad structure of claim 7, wherein the circuit pattern is further routed under the probing region.

11. A pad structure, comprising:
    a first metal-containing layer disposed over a substrate;
    a first passivation layer disposed over the first metal-containing layer, the first passivation layer having a first opening partially exposing the first metal-containing layer; and
    a pad layer disposed over the first passivation layer, the pad layer covering the first opening, the pad layer further comprising a probing region and a bonding region; and
    a conductive structure disposed through the first passivation layer, the conductive structure connecting the bonding region and the first metal-containing layer
    wherein the probing region contacts the first metal-containing layer through the first opening, and the entire bonding region overlies a portion of the first passivation layer.

12. The pad structure of claim 11, further comprising a conductive structure disposed through the first passivation layer, the conductive structure sealing the first passivation layer under the bonding region.

13. The pad structure of claim 11, further comprising an array of conductive contacts or vias disposed through the first passivation layer, the array of conductive contacts or vias connecting the bonding region and the first metal-containing layer.

14. The pad structure of claim 11, further comprising a second metal-containing layer adjacent to and below the first metal-containing layer, wherein the second metal-containing layer comprises a circuit pattern routed under the bonding region.

15. The pad structure of claim 14, wherein the circuit pattern is further routed under the probing region.

16. The pad structure of claim 11, further comprising a second passivation layer disposed over the first passivation layer, the second passivation layer comprising a second opening exposing the probing region and the bonding region.

17. The pad structure of claim 11, further comprising a wire bonded to the bonding region.

* * * * *